United States Patent [19]

Benedikt

[11] Patent Number: 4,571,375
[45] Date of Patent: Feb. 18, 1986

[54] RING-OPENED POLYNORBORNENE NEGATIVE PHOTORESIST WITH BISAZIDE

[76] Inventor: George M. Benedikt, 12900 Lake Ave., Lakewood, Ohio 44107

[21] Appl. No.: 613,550

[22] Filed: May 24, 1984

Related U.S. Application Data

[63] Continuation-in-part of Ser. No. 544,664, Oct. 24, 1983, abandoned.

[51] Int. Cl.⁴ ............................ G03C 1/52; G03C 1/71
[52] U.S. Cl. ..................................... 430/197; 430/194; 430/313; 430/325; 430/330; 430/927; 260/349
[58] Field of Search ............... 430/197, 194, 325, 313, 430/927, 330; 260/349

[56] References Cited

U.S. PATENT DOCUMENTS

| | | | |
|---|---|---|---|
| Re. 30,405 | 9/1978 | Fischer | 525/194 |
| 3,615,628 | 10/1971 | Mench et al. | 430/197 |
| 3,718,474 | 2/1973 | Kolb et al. | 430/197 |
| 3,860,424 | 1/1975 | Johnson | 430/319 |
| 3,887,373 | 6/1975 | Hays et al. | 430/196 |
| 3,984,250 | 10/1976 | Holstead et al. | 430/197 |
| 4,068,063 | 1/1978 | Ikeda et al. | 526/281 |
| 4,109,943 | 8/1978 | Ikeda et al. | 430/288 |
| 4,178,424 | 12/1979 | Tenney et al. | 526/283 |
| 4,287,294 | 9/1981 | Rubner et al. | 430/197 |
| 4,299,911 | 11/1981 | Ochi et al. | 430/197 |
| 4,469,778 | 9/1984 | Iwayanagi et al. | 430/194 |

*Primary Examiner*—Charles L. Bowers, Jr.

[57] ABSTRACT

A negative photoresist is formed from a photosensitized ("PS") composition having as an essential component, a homopolymer or copolymer having a major molar amount of a ring-opened unsubstituted tetracyclic norbornene ("NB"), and/or a substituted tetracyclic NB having non-polar substituents, and a minor amount, if any, of another NB, optionally also similarly substituted with non-polar substitutents. The negative photoresist formed by exposure of a film about 1 micron thick of the PS composition to ultraviolet light in the range from about 220–450 nanometers forms, in the contact mode, a pattern of lines and spaces which are developed in a substantially aliphatic hydrocarbon solvent so as to provide a high resolution in the range from about 1 micron to about 2 microns in the pattern. Lines in the pattern have essentially vertical walls and substantially unswollen contours.

13 Claims, No Drawings

RING-OPENED POLYNORBORNENE NEGATIVE PHOTORESIST WITH BISAZIDE

Cross-reference to related application

This is a continuation-in-part of Ser. No. 544,664 filed Oct. 24, 1983, abandoned.

BACKGROUND OF THE INVENTION

This invention is specially directed to a negative photoresist derived from a film-forming photosensitized ("PS") polymer composition in which a ring-opened tetracyclic norbornene ("NB") such as tetracyclododecene ("TD"), optionally substituted with non-polar groups, predominates (hence the term "polynorbornene"). The photoresist meets a particular critical criterion in the manufacture of integrated circuits, namely high resolution for high performance.

A resist is a radiation-sensitive material which is coated on a substrate and exposed to the radiation through a pattern mask, the exposure causing differential solubility between the exposed and unexposed regions which upon solvent development, will reproduce an image of the mask as a thin pattern of resist which is left on the substrate. In a negative photoresist formed from a PS polymer composition, the exposed regions are photocrosslinked while the unexposed regions are not. Subsequent processing (e.g. etching, doping, ion milling, and the like) of the resist-covered substrate affects only the open areas while the areas protected by the pattern remain unprocessed, so that after removal of the resist, the substrate has processed and unprocessed regions.

When a thin film of this PS polymer composition is exposed to ultraviolet ("u-v") light having a wavelength of from about 220–450 nanometers in the contact mode, so as to form a pattern of lines and spaces, the resolution in the pattern is in the range from about 1 micron to about 2 microns, and preferably 1 microns or better, when the thickness of the film is 1 micron before the film is exposed.

Numerous copolymers are known which contain a double bond capable of reacting with a bis-azide crosslinking agent (referred to herein as an "azide-reactive double bond") so as to provide a nitrene radical to which is attributable the photosenstivity of the composition.

Among such polymers containing an azide-reactive double bond are the ring-opened polymers or norbornene ("NB" for brevity) and its derivatives. PS compositions of particular ring-opened NB derivatives are disclosed in U.S. Pat. No. 4,106,943 (the '943 patent). Like the prior art 1,3-diolefin polymers used for negative photoresists, ring-opened NB polymers are also hydrocarbons with olefinic unsaturation, and as in PS compositions generally, it is essential, if they are to perform superbly, that they have special physical and chemical properties which are attributable to the hydrocarbon backbone. What appear to be small differences in the structure of the backbone result in very large differences in properties. At present there is no realistic or reliable way in which one might predict what changes in the structure of the polymeric backbone might result in particular photoresist properties. Therefore, the photoresist properties of a likely PS composition are investigated after the type of specific configuration of a repeating unit, and the type of bond formation is a polymer formed is duly established.

Though the '943 patent contains a description in Example 1 of how the ring-opened polymer is prepared, I have been unable to have the polymer of methyl-5-norbornene-2-carboxylate made as taught. Though the carboxylate polymer, and other polymers of norbornenes substituted with polar substituents may be made, photosensitive compositions based on such polymers do not provide a resolution in the range from 1 to 2 microns when a film 1 micron thick is exposed to u-v light in the range from 220–450 nanometers.

Further, the carboxylate polymer made was not soluble in a substantially aliphatic hydrocarbon solvent, most particularly it is essentially insoluble in Stoddard solvent, and therefore no developable in it after exposure to adiation to form an image ("image-wise exposure") on the PS film. By "substantially aliphatic hydrocarbon solvent" I refer to an aliphatic solvent obtained as a petroleum distillate such as Stoddard solvent which is a refined naphtha not less than 50% boiling over 177° C., 90% over 190° C., and the end point higher than 210° C. (see U.S. Bureau of Standards and ASTM D-484–52). Typically, Stoddard solvents contain no more than 10% by weight (wt), and usually less than 5% by wt of aromatic solvents.

By "soluble" I refer to the ability of the uncrosslinked PS polymer composition to form a gel-free solution (that is essentially 100% of the polymer is dissolved). By "developable" I refer to the ability of the developer ("solvent") to selectively dissolved the uncrosslinked polymer without substantially affecting the crosslinking polymer, that is, without evidence of contour deterioration by swelling. It is therefore implicit that the requirements of the solvent forming a solution from which the film is cast should be different from those of the developer.

Typically the casting solvent should have a boiling point (b pt) in the range from abut 110° C. to about 140° C. A lower b pt than specified leads to bubble formation or condensation of atmospheric moisture on the film since the film is deposited by high-speed spinning on a substrate under ambient room conditions. A higher b pt than specified leads to residual solvent in the film, softening the film, denigrating the resolution, and potentially leading to defects in the mask exposed in the contact mode. The requirements of the developer are that it dissolves the uncrosslinked film slowly, without substantially swelling the crosslinked film, therefore a higher b pt solvent than one in the specified range for casting solvent, is preferred. Implicity, a PS composition which is high in solubility in organic solvents or water, though excellent in sensitivity and stability, will nevertheless have poor resolution, typically from about 3 to 6 microns.

Essential criteria for an acceptable negative photoresist composition are adequate adhesion to a substrate upon which the film is deposited, and adequate photoresist solution stability. It is evident that the adhesion must be sufficient to secure the film to the substrate during subsequent etching. Yet, because the films of the '943 patent are not peeled off or torn off even by a strong shock at the time of development, high resolving power is ascribed to such films. Clearly, resolution is unrelated to adhesion of the film. If the film peels away during processing there can be no measurement or resolution; if it does not, the resolution may be poor or excellent, but not because the film adheres to the substrate whether such adherence is strong or weak.

Photosensitivity of a polymer compostion is unrelated to the resolution obtainable with it. A polymer with excellent photosensitivity, upon being photocrosslinked, may be easily swollen during development of the image resulting in unacceptably low resolution for an integrated circuit with a high density of devices. Sensivity, more precisely photospeed, determines the lenght of the exposure required to product an image with a preselected intensity of u-v light, not the resolution which may be realized. A typical exposure energy of 10-30 mJoule/cm$^2$ is characteristic for a relatively sensitive film such as one based on cyclized polyisoprene (e.g., Kodak 747, Waycoat IC); doubling or trebling the time for a relatively less sensitive film is not necessarily a detriment if upon development the film yields a higher resolution.

Since the requirement of lack of swelling to provide the critical 1 micron resolution is so stringent, it is evident that there is no indication that any single photoresist based on the '943 compositions would meet this requirement.

It is well known that the theoretical resolution of an optical system as defined for the contact mode is a function of the wavelength of the radiation to which the film is exposed, and, the thickness of the film. The wavelength is preselected in the u-v range from about 220-450 namometers. Since the minimum film thickness is about 0.7 micron to avoid pinholing, the best theoretical resolution is in the range from about 0.4 to about 0.6 micron, depending upon the wavelength in this range.

Commercial negative photoresists have a resolution in the range from about 2.5 to 3.0 microns in a 1 micron thick film exposed in the contact mode. This relatively poor resolution is attributable to the swelling of the photocrosslinked composition. When an integrated circuit is minaturized to incorporate a larger number of devices on the same size of chip, the resolution of the photoresist composition becomes critical.

There is no teaching in the prior art that the result effectiveness of a NB polymer which forms a critically high resolution negative photoresist not heretofore obtained, was predicated upon the necessary presence of a major molar amount of a ring-opened unsubstituted or non-polar group substituted tetracyclic NB, optionally with a minor amount of another NB monomer in a polycyclic norbornene (hence "PolyNB") polymer. By "high resolution" I refer to a resolution of from 1 to 2 microns, more preferably about 1 microns. By "another NB monomer" I refer to a NB having fewer than four fused rings, which NB provides a repeating unit containing a ring-opened (bicyclo(2.2.1)-hept-2-ene) namely 'norbornene', which may have acyclic or cyclic (spiro) substituents such as alkylnorbornene, cycloalkylnorbornene, phenylnorbornene ("PNB"), and the like; or, a repeating unit containing a ring-opened dicyclopentadiene ("DCPD") which may be substituted.

Nor is there any suggestion that an uncrosslinked NB polymer having the particular structure of a PolyNB polymer referred to hereinabove would have a $T_g$ above 150° C. A $T_g$ above this temperature happens to produce the desired critical performance as to resolution if exposed PS film cast with the polymer was developable in a substantially aliphatic hydrocarbon solvent. A high performance negative resist has been long sought after in the art (see *Solid State Technology*, by Elliott, David J., July 1983, p 139).

Cyclopentadine, a readily available byproduct from the production of ethylene, is a precursor of NB monomers, but these monomers have been only limited application in the formation of photoresists from Nb polymers because of their relatively poor resolution and high cost in comparison to polyisoprene-based PS compositions.

NB and substituted NBs may be produced by a Diels-Alder reaction of cyclopentadiene ("CPD") or DCPD with selected cyclic or acyclic olefins including 1-olefins, 2-olefins, 3-olefins and cyclopentene. U.S. Pat. No. 3,074,918 teaches the polymerization of cyclic olefins having at least one unsubstituted ring double bond and not more than one double bond in each ring such as DCPD, dihydroDCPD, NB, or substituted NBs. U.S. Pat. No. 3,546,183 describes elastomer polymers or polymers which may be used as bases for elastomer compositions, having in their structural formula units of alkyl-5-bicyclo(2.2.1-hept-2-ene or alkoxy-5-bicyclo(2.2.1) hept-2-ene. U.S. Pat. No. 4,178,424 describes the preparation of copolymers of tetracyclododecenes ("TD") and DCPD which are fused-ring monomers which may have ring substituents, and also substituted monocyclo NBs which may have spiro and other substituents. In the foregoing and other polymerizations based on the ring-opening of a NB or substituted NB monomer, an alpha-olefin such as 1-hexene is used as a molecular weight regulator, the alpha-olefin functioning as a chain terminator. Other U.S. patents disclosing NB-type polymers include U.S. Pat. Nos. 2,721,189; 2,831,037; 2,932,630; 3,330,815; 3,367,924; 3,467,633; 3,836,593; 3,879,343; 4,020,021; and 4,136,249; and, the disclosures of each of the foregoing are incorporated by reference thereto as if fully set forth herein.

SUMMARY OF THE INVENTION

I have discovered that only a relatively few negative photoresists derived from the class of photosensitized ("PS") polycyclic norbornene (hence "PolyNB") polymers are able to provide the critical resolution in the range from about 1 micron to about 2 micron, and preferably 1 micron or better, in the contact mode, which resolution is so desirable in the manufacture of integrated circuits having a high density of devices. These PolyNB polymers are characterized in that they contain a major molar amount of a ring-opened unsubstituted or non-polar group substituted tetracyclic NB monomer, and a minor amount, if any, of another NB monomer. Such ring-opened PolyNB polymers have a $T_g$ higher than 150° C. before they are photocrosslinked. Moreover, the PS polymers, upon image-wise exposure, are developable in Stoddard solvent essentially without swelling the crosslinked polymer, as is evidenced by vertical walls on image features developed, and the presence of standing waves along those walls, the waves being parallel to the substrate if the substrate is reflective.

Photoinsolubilization is effected by reaction o the PolyNB polymer with the bis-azide when the photocrosslinkable ("PC") composition is coated on a substrate and exposed to light. Unexposed polymer is washed away with Stoddard solvent, and the exposed polymer remaining is preferably baked to remove traces of solvent and improve adhesion to the substrate. Most preferred substrate is a silicon wafer such as is used in manufacturing semiconductor devices.

The PolyNB polymer may be represented by the structural formula $$[M_mQ_q]_n \quad (I)$$

wherein, $m+q=1$, and q may be 0 q is less than 0.5, preferably less than 0.2;

m is greater than 0.5, preferably greater than 0.8;

n is a number in the range from about 10 to about 10,000;

M represents a ring-opened monomer having the structure

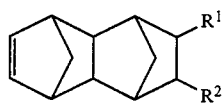 (II)

and,

Q represents a ring-opened monomer having the structure

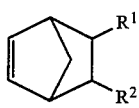 (III)

wherein, $R^1$ and $R^2$ are each independently hydrogen, alkyl or alkylene having from 1 to about 10 carbon atoms provided that the total number of carbon atoms for $R^1$ and $R^2$ is not greater than 20 or, $R^1$ and $R^2$ are each independently phenyl or naphthyl; or, $R^1$ and $R^2$ may be connected to form cycloalkyl or cycloalkylene having from 5 to 10 ring carbon atoms, either of which cycloalkyl or cycloalkylene may have a benzo-naphtho- substituent.

The aryl bis-azide may be a conventional bis-azide such as is currently in used and represented by the structural formula

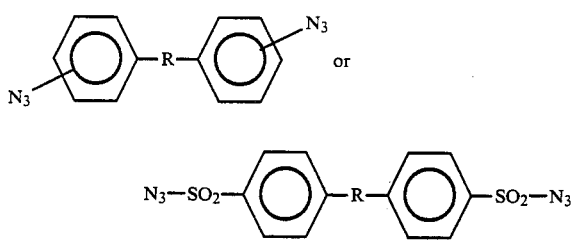

wherein, R represents a group selected from the following

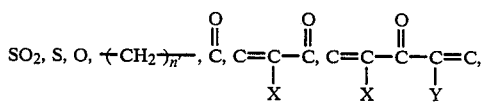

wherein n' is an integer in the range from 1 to 5; and in which X and Y may be hydrogen, alkyl having from 1 to about 20 atoms, or X and Y may be combined to form an oxo-cycloalkyl having from 5 to about 8 carbon atoms, optionally with ring substituents, such as

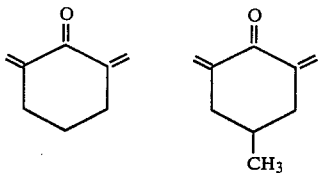

It is therefore a general object of this invention to provide a negative photoresist derived from a PS composition consisting essentially of a homopolymer or copolymer of a tetracyclic NB; or, of a copolymer of a tetracyclic NB with another NB, either of which may be substituted with non-polar groups, and an aryl bis-azide, a solution of which composition in a suitable solvent is coated on a substrate or support element and dried prior to predetermined portions of the composition being exposed to light.

It is a specific object of this invention to provide a silicon wafer coated with a high resolution negative photoresist having a thickness in the range of from about 0.75 micron to about 1.25 microns derived from the aforespecified polymer composition, the film becoming essentially insoluble in Stoddard solvent containing less than 10% by weight of an aromatic solvent such as xylene, toluene and the like, when the film is photocrosslinked by u-v light while the solvent dissolves the uncrosslinked polymer.

It is also a specific object of this invention to provide a negative photoresist derived from a PS composition of the PolyNB polymer in which the $T_g$ may be tailored by copolymerization of a TD/substituted TD with another NB having less than four fused rings, to fall in the range from above 150° C. to about 250° C.

It is another specific object of this invention to provide a high resolution, high performance negative photoresist derived from a PS composition which upon photocrosslinking with an aryl bis-azide is essentially free of swelling due to absorption of a substantially aliphatic hydrocarbon solvent as evidenced by essentially vertical walls on lines of photocrosslinked polymer separating spaces, and standing waves on the walls.

DETAILED DESCRIPTION OF PREFERRED EMBODIMENTS

Various groups of ring-opened polycyclic norbornene polymers (hence "PolyNB polymers") of varying chain lengths and cyclicity may be crosslinked with an aryl bis-azide photocrosslinker ("sensitizer") by using an appropriate intensity of light of suitable wavelength and exposing the PS composition to the light for an adequate period of time. The effectiveness of the PS composition to provide a high resolution negative photoresist is predicated upon the necessary presence in the PolyNB of a major molar amount of a polycyclic NB having at least four fused rings. This criterion was not recognized to be a result effective variable upon which high resolution was critically dependent, recognizing that the practical limit of an acceptable thin film is 0.75 micron for a PS composition exposed to u-v light in the range 220–450 nanometers.

The weight average molecular weight (measured by gel permeation chromatography) of useful photocrosslinkable ("PC") PolyNB polymers ranges from about 25,000 to about 200,000 and more preferably from about 50,000 to about 80,000. The molecular weight distribution, that is, the ratio of the weight average molecular weight to the number average molecular weight, falls within the broad range from 1.5 to about 10, and more preferably within the range from 1.5 to about 4.

The relative proportion of the PolyNB polymer and sensitizer may be varied as conditions dictate, but the proportions of the sensitizer in the dried PS composition will typically be within the range of from about 1 to about 10 percent by weight (% by wt) of the PolyNB polymer, the preferred range being from about 3 to about 7% by wt.

The specific concentration of sensitizer may generally vary over a wide range, but will ordinarily be dependent on the specific sensitizer used, on the thickness of the PS layers desired or required, and on the specific end use of the photoinsolubilized layer. Although the content of the sensitizer has been indicated to be based on the PNB polymers, it is understood that the formulation may be based on the solution itself, which in such circumstances will be in the general range of from about 0.1% to about 2% by wt, more preferably in the range of from about 0.3 to about 1.4% by wt. In each individual case, the optimum concentration can be determined by techniques well known in the art.

In use, the film-forming PS composition is applied as a solution in a suitable solvent commonly employed in the art for coating polymers on suitable supports used conventionally for photoresist elements. Typical solvents include Stoddard solvent, benzene, toluene, xylene, halogenated aromatics such as chlorobenzene, tetrahydrofuran, decalin and mixtures thereof, and such other solvents as may provide a desirably effective developer without deleteriously affecting the desired resolution obtainable with the PC polymer.

In general, any inert solvent which meets the criteria referred to hereinbefore may be employed in view of its sole function as a mere vehicle for coating the PS composition to obtain the desired about 1 micron thickness on dried film on a support element, and the selection of the solvent may include those enumerated above. The solids content of the composition need only be sufficient to provide the desired film thickness on the support element, which thickness typically may be in the range of from about 0.75 micron to about 2 microns, with a solids content of from about 7 to about 20% by wt in the resist solution providing such thicknesses.

In the best mode, the resist is derived from a film coated on a silicon wafer by any of the conventional methods used in the photoresist art which can include dipping, spraying, spin-coating etc. After application, solvent from the coating is driven off, as by evaporation, to leave a thin solid coating of the PS composition on the wafer. For example, the wafer may be 'soft baked' (first bake), at a low temperature, e.g. about 80° C. to about 110° C., for a short period of time, e.g. about 10 to about 60 minutes, to drive off residual solvent. Typical supports include any of the various conventional base materials to which the PS compositions will adhere, such as a silicon wafer the surface of which is oxidized or contains a layer of silicon nitride, glass, paper, resin, impregnated or reinforced paper, solid resinous sheets, metal sheets such as aluminum, zinc, magnesium, copper, etc. and the like.

The support, coated with a dried film of the PS composition, is then exposed to u-v light (220-450 nanometers) in a predetermined pattern corresponding to the ultimate pattern desired. Generally such exposure is effected by means of suitable masks, negatives, stencils, templates, etc., and induces photoinsolubilization of the coating in the exposed areas thereof. To obtain the desired resolution in the range from 1 to 2 microns with a 1 micron thick film, it is most preferred to make a 'print' of the mask in the contact mode. However, it will be evident that proximity or projection printing may also be employed where maximum resolution is not of specific importance. The exposed coating may then be developed by treating it in Stoddard solvent to dissolve and wash away unexposed polymer leaving the desired resist image (pattern) corresponding to the exposed areas in which photoinsolubilization was induced, and thus provide optimum resolution.

Photoinsolubilization by cross-linking of the PolyNB polymer is effected by exposing the homogeneously mixed polymer and sensitizer to a source of actinic radiation from any source and of any type as long as it furnishes a sufficient amount (intensity) of radiation in the range from 220-450 nanometers to induce the desired insolubilization of the composition. Typical sources of lighting are commercially available and include carbon arcs, mercury vapor lamps and the like. As will be understood, the effect of the sensitizer is to insolubilize the PS composition relative to a substantially aliphatic hydrocarbon solvent, or unacceptable swelling of the PC lines will occur, vitiating the resolution sought.

The resist so obtained is preferably heated in one or more stages to enhance the crosslinking and adhesion of the PC polymer to the silicon wafer in the exposed areas. For example, in a second bake, the coating and wafer are preferably baked at a temperature near or above the $T_g$ of the polymer for a suitable period ranging from about 150° C. to about 250° C. and from 0.25 hr to about 2 hr, depending upon the particular polymer used, but below a temperature deleterious to the silicon wafer.

The negative photoresists of this invention may be applied on silicon wafers and other substrates used in the manufacture of printed circuits; and, may be used in applications requiring chemical milling, and in the various general fields of photomechanical and photographical reproductions, lithography and intaglio printing, such as offset printing, silk screen printing, manifold stencil sheeting coatings, lithographic plates, relief plates, gravure plates, and the like, though it will be appreciated that from a practical point of view, these photoresists will only be used where high resolution is essential.

The ring-opened PNB polymer is preferably a homopolymer or copolymer believed to be a linear unsaturated polymer containing predominantly ring-opened TD/substituted TD repeating units, the remaining repeating units, if any, being of another ring-opened NB such as DCPD/substituted DCPD, NB/substituted NB, and the like, the repeating units being in essentially random order.

When the structure (I) represents a copolymer of TD/substituted TD (II) and another NB (III), q is a positive fraction, that is, greater than zero, and Q represents the structure

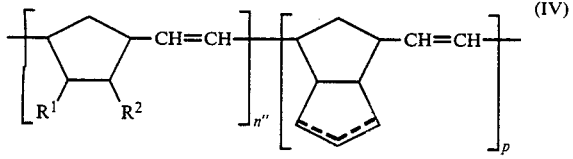

wherein,

R$^1$ and R$^2$ have the same connotation as hereinbefore, the ring double bond may be in either position shown; and, q=n''+p; and either n'' or p may be 0.

When the structure (I) represents a copolymer of tetracyclic NB monomers (II), q=0, and the copolymer (I) represents the structure

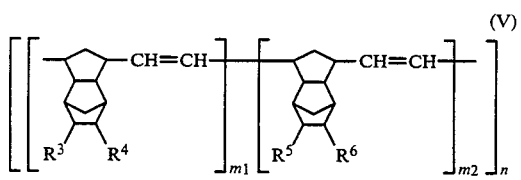

wherein, m$_1$+m$_2$=m, but m$_2$ is no more than 0.2m$_1$;

each of R$^3$ and R$^4$ are independently hydrogen, alkyl or alkylene having from 1 to about 10 carbon atoms provided that the total number of carbon atoms for R$^3$ and R$^4$ is not greater than 20; or, R$^3$ and R$^4$ may be connected to form cycloalkyl or cycloalkylene having from 5 to 10 ring carbon atoms, either of which cycloalkyl or cycloalkylene may have a benzo- or naphto-substituent; and, R$^5$ and R$^6$ are each independently phenyl or naphthyl.

Depending upon the olefin employed in the Diels-Alder reaction with cyclopentadiene the resulting NB will be a monoalkyl, a monoaryl, a monoalkylene, a dialkyl, a monoalkyl-monoalkylene, a dialkylene or a monocyclic or polycyclic derivative. A monoalkyl NB results with an alpha-olefin; a monoalkylene NB results with a diolefin having an alpha-unsaturation; a dialkyl NB results with a 1,2-disubstituted olefin having no alpha-unsaturation; etc., as described in greater detail in aforementioned U.S. Pat. No. 4,168,282 when CPD or DCPD is reacted with the olefinic compounds, preferably at elevated temperature in the range from about 100° C. to about 300° C. at a pressure, preferably in the range from about 50 pounds/in$^2$ gauge (psig) to about 2500 psig, but at least sufficient to maintain the reaction in liquid phase, and in the presence of a chlorinated or brominated hydrocarbon solvent.

Any desired NB monomer or monomers may be prepared according to techniques well known in the art, and form no part of this invention. Numerous homopolymers and copolymers of various NB monomers may be prepared by conventional methods as for example described in U.S. Pat. No. 4,178,424, and PolyNB polymers may be tailored by simple trial and error to provide the particular characteristics desired for particular resists.

Most preferred PolyNB homopolymers and copolymers of tetracyclic NBs are selected from TD/substituted TD, methyl tetracyclododecene ("MTD")/substituted MTD, and phenyl tetracyclododecene ("PTD")/substituted PTD, provided than when PTD is present, the PolyNB is a copolymer of tetracyclic NBs in which PTD is present in a molar amount no greater than 0.2 times the molar amount of the other tetracyclic NBs as set forth in the structure (V) hereinabove. Preferred 'another NB monomers' are methyl norbornene ("MNB"), phenyl norbornene ("PNB"), DCPD, and the like.

It will be recognized that the PolyNB polymers may be mixed with any prior art PS cyclized rubbers in such proportion in which there is no phase separation upon drying the film from a solution in a cosolvent, but resolution will be sacrificed. If this is done, the PS composition comprises compatible PolyNBs and prior art PS polymers which form a film which is essentially transparent. In general, plural phases due to immiscibility of the polymers, and evidenced by multiple glass transition temperatures (T$_g$) are not preferred. If the PolyNB polymer is mixed with prior art PC polymers, the T$_g$ is necessarily greater than 150° C., or the desired high resolution in the 1 to 2 micron range will not be obtained.

Though any photocrosslinker will provide photoinsolubilized copolymer upon exposure to light, the bisazides capable of absorbing light of preselected wavelength are preferred, and the aryl bis-azides are most preferred. The bis-azides having the structure (II) are conveniently prepared and many are commercially available. Typically favored photocrosslinkers are 4,4'-bis-azidostilbene; 4,4'-bis-azidobenzophenone; 4,4'-bis-azobenzalacetone; 2,6-bis-(4'-azidobenzylidene)-4-methylcyclohexanone; 4,4'-bis-azidochalcone; 1,2-bis-(4-azidocinnamoyloxy)-ethane, and the like.

The optimum thickness at which the PS composition is coated on a silicon wafer may be readily determined according to conventional methods. The thinner the polymer film on the wafer, the better the resolution. The minimum thickness of the film is determined by the appearance of pinholes in the film. Though prior art films are stated to be coated in thicknesses from 0.1 to about 0.6 micron, such films are invaribly pinholed and therefore unacceptable for manufacturing integrated circuits. This proclivity to pinholing in such thin films has resulted in films from 0.75 to 1 micron thick being currently used where resolution of 1 micron is a requirement. No currently available, and no prior art negative photoresist that I am aware of, is capable of producing a 1 micron resolution or better with a film which is 1 micron thick, or thicker.

It will be evident that a wide choice of PolyNB homopolymers and copolymers produced by conventional ring-opening polymerization may be prepared, the precise properties of each polymer being a function of the components, their relative proportions, the molecular weight of the polymer, the dispersivity inter alia, and a polymer may be tailored with a little trial and error to fit a particular end use. For the particular purpose of producing negative photoresists, the following polymers are useful. Some provide a resolution of better than 1 micron (about 0.8 to 0.95 micron), others a resolution of about 1 micron, and still others a resolution which is greater than 1 micron (about 1.0 to about 1.8 micron):

methyl tetracyclododecene and methyl norbornene;
methyl tetracyclododecene, methyl norbornene and dicyclopentadiene;
methyl tetracyclododecene and dicyclopentadiene;
methyl tetracyclododecene and phenyl norbornene;

methyl tetracyclododecene and phenyl tetracyclododecene;
tetracyclododecene and methyl norbornene;
tetracyclododecene, methyl norbornene and dicyclopentadiene;
tetracyclododecene and dicyclopentadiene;
tetracyclododecene and phenyl norbornene;
tetracyclododecene and phenyl tetracyclododecene;
homo(methyl tetracyclododecene);
methyl tetracyclododecene, methyl norbornene and phenyl norbornene; and,
tetracyclododecene, methyl norbornene and phenyl norbornene.

It is particularly noteworthy and surprising that my photoresist is essentially free from swelling due to the solvent used to develop the exposed film. Evidence of freedom from swelling is provided in scanning electron microscope ("SEM") photographs which show lines with vertical walls having standing waves ("striations"). Though Elliott states "Since the occurrence of standing waves seems almost inevitable regardless of the type of resist, exposure equipment, or lamp used, process-induced methods are necessary to minimize the effect." (see *Integrated Circuit Fabrication Technology* by Elliott, David J., p 187, McGraw Hill Book Company 1982), I am unaware of any report that standing waves were observed on the walls of lines on a negative photoresist.

This freedom from swelling is attributable to the presence of a major molar amount of tetracyclododecene in the PolyNB polymer and, as mentioned hereinabove, prior art PC compositions may be improved with respect to their sensitivity to swelling, by having an NB polymer mixed therewith in a cosolvent.

EXAMPLE 1

A copolymer of 90% methyltetracyclododecene ("MTD") and 10% methyl norbornene ("MNB") having a weight average molecular weight (by GPC) $\overline{Mw}=64800$ and a number average molecular weight $\overline{Mn}=26000$ ($\overline{Mw}/\overline{Mn}=2.5$) was formulated into a photoresist solution in xylene. The solution contains 12.7% by weight (% by wt) polymer. To this solution was added 2,6-bis(4-azidobenzylidene)-4-methyl cyclohexanone (obtained from Polysciences Inc. and recrystallized from ethanol), in an amount about 6% by wt of the polymer. The solution containing polymer and bis-azide was spun onto an oxidized silicon wafer at 4800 revolutions per minute (rpm) so as to deposit a film about 1 micron thick. The film was soft-baked for 19 minutes at about 68° C. to 74° C., and the coated wafer was exposed through a Series I multidensity resolution target (also referred to as a variable transmission test resolution mask) obtained from Ditric Optics. Exposure was made with a Kasper 3001 mask aligner having a main wavelength (u-v) of 365 nanometers, in the contact mode, and the total time of exposure may be varied as desired about 20 sec being preferred. Due to the variable transmittance mask used, a range of 5% to 60% of the incident light was used, that is, from 1 sec to 12 sec exposure. After exposure, the thickness of the film was measured mechanically with a Tencor Alpha Step instrument, and the thickness was found to be 1 micron. The measurement of the thickness of the film may be made immediately after soft-baking, but it is preferred to make it after exposure, for practical reasons, there being no loss of material upon exposure and therefore no reason to expect that the thickness will vary.

After exposure, the wafer was developed by immersion for 45 sec in a beaker containing Stoddard solvent, and then for an additional 15 sec in fresh Stoddard solvent in a second identical beaker. The wafer was then rinsed for 10+5 sec in two beakers containing n-butyl acetate and the excess solvent was dried off.

The test image consisted of well-resolved lines and spaces the smallest of which was less than 1 micron. Measurement of resolution was made by photographing the developed image both with an optical microscope and a SEM.

An examination of the SEM photographs shows that the walls on the 1 micron thick lines are vertical and planar and display characteristic standing waves, referred to hereinabove, on the vertical surfaces of the walls. These standing waves on the walls are a fingerprint of the NB polymers in this application. These standing waves are a clear indication that there is essentially no swelling of the photoinsolubilized polymer by the solvent used to develop the image. A comparison with prior art images shows that such images have rounded walls free of standing waves (the lines are referred to as "hot dogs" because of their obvious visual similarity) indicating that the lines in the image have swollen during the development.

The developed image was post-baked at 203° C. for optimum adhesion to the wafer, and the base oxide on the wafer was etched using buffered hydrofluoric acid. After stripping the polymer from the etched wafer it was found that less than 1 micron resolution of silicon oxide lines on the silicon was obtained.

EXAMPLE 2

A copolymer of MTD and PNB (90 parts by wt MTD and 10 parts PNB) was spin-coated on a silicon wafer to provide a film 1 micron thick, or thicker, and processed in a manner analogous to that described in Example 1 hereinabove, using Stoddard solvent as the developer. The resolution obtained was 1 micron.

In an analogous manner, the following copolymers were used to produce photoinsolubilized images which were developed in suitable solvents and the resolutions measured:

TABLE 1

| Copolymer | Prop. by wt of monomers | Resolution (micron) |
| --- | --- | --- |
| MTD/MNB/DCPD | 85:10:5 | 1.0 |
| TD/MNB/DCPD | 75:25:5 | 1.6 |
| MTD/MNB | 90:10 | 1.0 |
| MTD/PNB/DCPD | 85:10:5 | 1.0 |
| MTD/PNB | 90:10 and 80:20 | 1.0 |
| TD/PNB | 85:15 | 1.25 |
| TD/PNB/DCPD | 85:15:10 | 1.0 |
| MTD/PTD | 90:10 | 1.0 |
| TD/PTD | 95:5 | 1.0 |

The foregoing results were obtained in the contact mode as will be evident from the specification of the equipment used to expose the film. Analogous results but lower resolutions are obtained in projection printing with a Perkin Elmer Micralign 500 projection mask aligner, and also with a proximity aligner.

As is well known in the art, stabilizing agents such as antioxidants may be added to the PS composition to improve the shelf-life of the PS composition, provided that the antioxidant does not absorb u-v light in the range used for exposing film. Typically, a hindered phenol antioxidant is added to the PolyNB immediately after short-stopping the polymerization reaction and before work-up of the polymer. As is also conventional, silane coupling agents may be used to improve adhesion of the film to the substrate, particularly silicon wafers. When such additives are used their amounts are limited to less than 0.1% by weight based on the weight of PolyNB polymer. It is of particular interest that the resolution obtained with any thickness of film of my composition may be improved by slight underexposure because it does not swell. In contrast, slight underexposure results in much worse resolution in prior art compositions because they swell.

I claim:

1. A negative photoresist composition capable of forming by exposure of a film about 1 micron thick of a photosensitized ring-opened polycyclic norbornene ("PolyNB") polymer composition to ultraviolet light in the range from about 220–450 nanometers in the contact mode, a pattern of lines and spaces which upon development in a substantially aliphatic hydrocarbon solvent is capable of providing a resolution in the range from about 1 micron to about 2 microns in said pattern, said polymer composition having as an essential component, a major molar amount of a ring-opened unsubstituted or non-polar group substituted tetracyclic norbornene, and a minor molar amount greater than zero of another norbornene, and including an effective amount sufficient to yield a photocrosslinked polymer developable into said pattern, of an aryl bis-azide sensitizer in admixture with said PolyNB polymer which has a glass transition temperature before it is crosslinked, higher than 150° C.

2. The negative photoresist composition of claim 1 wherein said PolyNB polymer is represented by the structure

[M$_m$Q$_q$]$_n$ wherein,
m+q=1, and q is greater than 0;
q is less than 0.5;
m is greater than 0.5;
n is a number in the range from about 10 to about 10,000;
M represents the residue of a ring-opened monomer having the structure

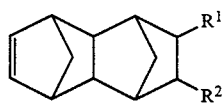

and,

Q represents the residue of a ring-opened monomer having the structure

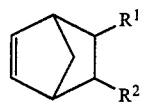

wherein,
R$^1$ and R$^2$ are each independently hydrogen, alkyl or alkylene having from 1 to about 10 carbon atoms provided that the total number of carbon atoms for R$^1$ and R$^2$ is not greater than 20; or,
R$^1$ and R$^2$ are each independently phenyl or naphthyl; or,
R$^1$ and R$^2$ may be connected to form cycloalkyl or cycloalkylene having from 5 to 10 ring carbon atoms, either of which cycloalkyl or cycloalkylene may have a benzo- or naphto- substituent.

3. The negative photoresist of claim 2 wherein said development produces lines with essentially vertical walls and substantially unswollen contours.

4. The negative photoresist of claim 2 wherein the molecular weight distribution or dispersivity of said PolyNB polymer is in the range from about 1.5 to about 4.

5. The negative photoresist of claim 2 wherein said aryl bis-azide is represented by the structural formula

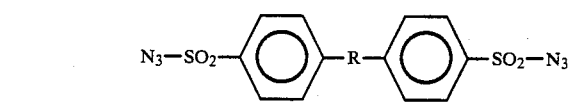

or

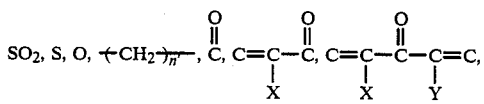

wherein, R represents a moiety selected from the group consisting of

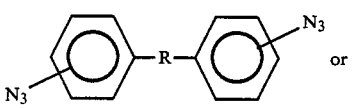

wherein,
n' is an integer in the range from 1 to 5;
X and Y may be hydrogen, alkyl having from 1 to about 20 carbon atoms, or X and Y may be combined to form cycloalkyl having from 5 to about 8 carbon atoms, optionally with ring substituents.

6. The negative photoresist of claim 5 wherein said PolyNB polymer is represented by the structural formula

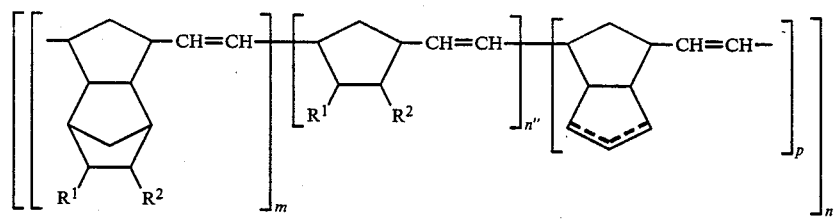

wherein,
n''+p=q, and either n'' or p may be 0; and, $R^1$, $R^2$, m, n and q have the same connotation as that given hereinabove.

7. The negative photoresist of claim 5 wherein said PolyNB is a copolymer of tetracyclic norbornene monomers, the copolymer being represented by the structure

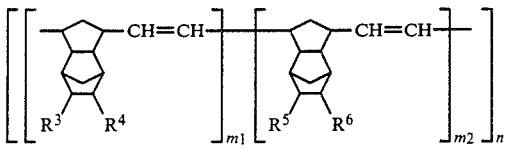

wherein, $m_1 + m_2 = m$, but $m_2$ is no more than $0.2 m_1$;

each of $R^3$ and $R^4$ are independently hydrogen, alkyl or alkylene having from 1 to about 10 carbon atoms provided that the total number of carbon atoms for $R^3$ and $R^4$ is not greater than 20; or, $R^3$ and $R^4$ may be connected to form cycloalkyl or cycloalkylene having from 5 to 10 ring carbon atoms, either of which cycloalkyl or cycloalkylene may have a benzo- or napho- substituent; and, $R^5$ and $R^6$ are each independently phenyl or naphthyl.

8. The negative photoresist of claim 6 wherein said PolyNB polymer is a copolymer of a tetracyclic norbornene M selected from the group consisting of tetracyclododecene, methyl tetracyclododecene, and another monomer Q selected from the group consisting of norbornene, methyl norbornene and dicyclopentadiene.

9. The negative photoresist of claim 7 wherein said PolyNB polymer is a copolymer of a tetracyclododecene and phenyl tetracyclododecene; or of methyl tetracyclododecene and phenyl tetracyclododecene.

10. The negative photoresist of claim 6 wherein said PolyNB polymer is selected from polymers of
methyl tetracyclododecene and methyl norbornene;
methyl tetracyclododecene, methyl norbornene and dicyclopentadiene;
methyl tetracyclododecene and dicyclopentadiene;
methyl tetracyclododecene and phenyl norbornene;
methyl tetracyclododecene and cyclopentene;
tetracyclododecene and methyl norbornene;
tetracyclododecene, methyl norbornene and dicyclopentadiene;
tetracyclododecene and dicyclopentadiene;
tetracyclododecene and phenyl norbornene;
methyl tetracyclododecene, methyl norbornene and phenyl norbornene;
tetracyclododecene and phenyl tetracyclododecene; and,
methyl tetracyclododecene and phenyl tetracyclododecene.

11. A light-sensitive photographic material comprising a substrate and a coating thereon of a negative photoresist comprising, (a) a ring-opened polycyclic norbornene ("PolyNB") polymer having a glass transition temperature greater than 150° C. and a structure represented by the formula $[M_m Q_q]n$ wherein, $m + q = 1$, and q is greater than 0;
q is less than 0.5;
m is greater than 0.5;
n is a number in the range from about 10 to about 10,000;

M represents the residue of a ring-opened monomer having a tetracyclic norbornene structure; and, Q represents the residue of another ring-opened monomer having a norbornene structure with less than four fused rings;

either M or Q have substituents which are independently hydrogen, alkyl or alkylene having from 1 to about 10 carbon atoms provided that the total number of carbon atoms for both substituents is not greater than 20; or, the substituents are each independently phenyl or naphthyl; or, the substituents may be connected to form cycloalkyl or cycloalkylene having from 5 to 10 ring carbon atoms, either of which cycloalkyl or cycloalkylene may have a benzo- or naphtho- substituent; and, (b) an aryl bis-azide sensitizer in sufficient amount which upon exposure to u-v light in the range from 220–450 nanometers yields a crosslinked polymer developable into a pattern with a substantially aliphatic hydrocarbon solvent so as to provide a resolution in the range from 1 micron to about 2 microns in said pattern.

12. A negative photoresist composition capable of forming, by exposure of a film about 1 micron thick of a photosensitized ring-opened polycyclic norbornene ("PolyNB") homopolymer composition to ultraviolet light in the range from about 220–450 nanometers in the contact mode, a pattern of lines and spaces which upon development in a substantially aliphatic hydrocarbon solvent is capable of providing a resolution in the range from about 1 micron to about 2 microns in said pattern, said homopolymer being a ring-opened unsubstituted or non-polar group substituted tetracyclic norbornene having a glass transition temperature greater than 150° C. and the structure

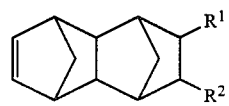

wherein, $R^1$ and $R^2$ are each independently hydrogen, alkyl or alkylene having from 1 to about 10 carbon atoms provided that the total number of carbon atoms for $R^1$ and $R^2$ is not greater than 20; or, $R^1$ and $R^2$ are each independently phenyl or naphthyl; or, $R^1$ and $R^2$ may be connected to form cycloalkyl or cycloalkylene having from 5 to 10 ring carbon atoms, either of which cycloalkyl or cycloalkylene may have a benzo- or napho- substituent; and, an aryl bis-azide sensitizer in sufficient amount which upon exposure to u-v light in the range from 220–450 nanometers yields a cross-linked polymer developable into a pattern with a substantially aliphatic hydrocarbon solvent so as to provide a resolution in the range from 1 micron to about 2 microns in said pattern.

13. A light-sensitive photographic material comprising a substrate and a coating thereon of a negative photoresist comprising, (a) a ring-opened polycyclic norbornene ("PolyNB") homopolymer having a glass transition temperature greater than 150° C. and a structure represented by the formula

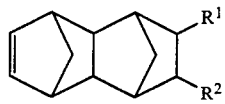

wherein, $R^1$ and $R^2$ are each independently hydrogen, alkyl or alkylene having from 1 to about 10 carbon atoms provided that the total number of carbon atoms for $R^1$ and $R^2$ is not greater than 20; or, $R^1$ and $R^2$ are each independently phenyl or naphthyl; or, $R^1$ and $R^2$ may be connected to form cycloalkyl or cycloalkylene having from 5 to 10 ring carbon atoms, either of which cycloalkyl or cycloalkylene may have a benzo- or naphto- substituent; and, (b) an aryl bis-azide sensitizer in sufficient amount which upon exposure to u-v light in the range from 220–450 nanometers yields a crosslinked polymer developable into a pattern with a substantially aliphatic hydrocarbon solvent so as to provide a resolution in the range from 1 micron to about 2 microns in said pattern.

* * * * *